United States Patent
Rowell et al.

(10) Patent No.: US 10,830,811 B2
(45) Date of Patent: Nov. 10, 2020

(54) OVER-THE-AIR TEST SYSTEM AS WELL AS METHOD FOR MEASURING THE OVER-THE-AIR PERFORMANCE OF A DEVICE UNDER TEST

(71) Applicant: Rohde & Schwarz GmbH & Co. KG, Munich (DE)

(72) Inventors: Corbett Rowell, Munich (DE); Guido Apenburg, Munich (DE); Stefan Ullrich, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 85 days.

(21) Appl. No.: 16/219,576

(22) Filed: Dec. 13, 2018

(65) Prior Publication Data
US 2019/0212386 A1     Jul. 11, 2019

(30) Foreign Application Priority Data
Jan. 10, 2018   (EP) ..................................... 18151095

(51) Int. Cl.
*G01R 31/28*     (2006.01)
*H04B 17/00*     (2015.01)
(Continued)

(52) U.S. Cl.
CPC ......... *G01R 31/2874* (2013.01); *G01K 17/08* (2013.01); *G01R 29/105* (2013.01); *G01R 31/2879* (2013.01); *H04B 17/0085* (2013.01); *H04B 17/29* (2015.01); *G01K 2217/00* (2013.01); *H04B 17/15* (2015.01)

(58) Field of Classification Search
None
See application file for complete search history.

(56) References Cited

U.S. PATENT DOCUMENTS

| 5,511,434 A | 4/1996 | Baker et al. |
| 2007/0164755 A1* | 7/2007 | Stojcevic ............. G01R 29/105 |
| | | 324/627 |

(Continued)

FOREIGN PATENT DOCUMENTS

| EP | 3 035 730 A1 | 6/2016 |
| WO | 02/056041 A1 | 7/2002 |

*Primary Examiner* — Paresh Patel
(74) *Attorney, Agent, or Firm* — Christensen O'Connor Johnson Kindness PLLC

(57) ABSTRACT

An over-the-air test system for measuring the radiation performance as a function of temperature of a device under test is described, wherein the device under test has at least one antenna unit and at least one radio frequency circuit. The over-the-air test system comprises a measurement antenna unit, a measurement unit for at least one of signal generation and signal analysis, an enclosure that provides an internal space for accommodating the device under test for testing purposes in a sealed manner, and an atmosphere conditioning system that is configured to adapt the atmosphere within the internal space. The enclosure comprises at least one sealable opening via which the internal space is connectable with the atmosphere conditioning system to adapt the atmosphere within the internal space for the testing. Further, a method for measuring the over-the-air performance of a device under test is described.

20 Claims, 2 Drawing Sheets

(51) Int. Cl.
*H04B 17/29* (2015.01)
*G01K 17/08* (2006.01)
*G01R 29/10* (2006.01)
*H04B 17/15* (2015.01)

(56) References Cited

U.S. PATENT DOCUMENTS

2016/0183108 A1* 6/2016 Mehrgardt ........... H04B 1/3822
                                                 455/456.1
2017/0016944 A1   1/2017 Esplin et al.

* cited by examiner

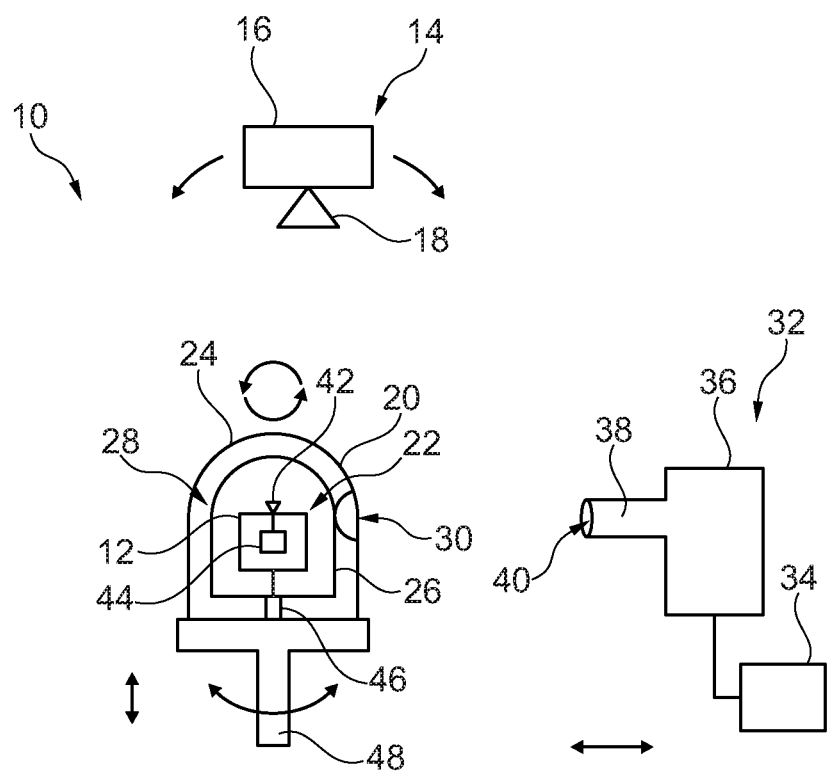
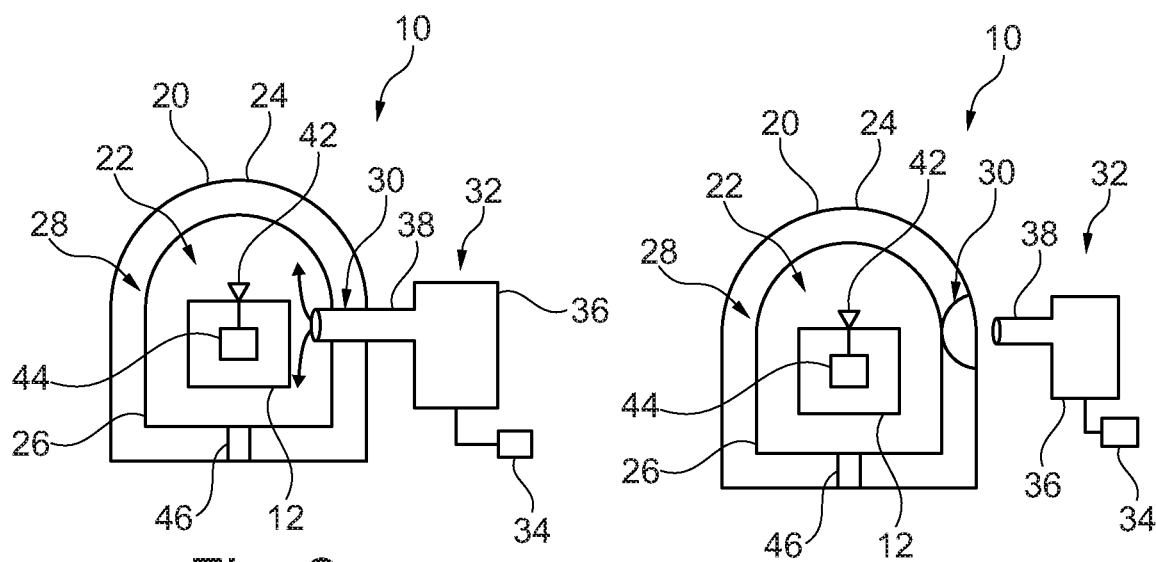

OVER-THE-AIR TEST SYSTEM AS WELL AS METHOD FOR MEASURING THE OVER-THE-AIR PERFORMANCE OF A DEVICE UNDER TEST

FIELD OF THE DISCLOSURE

Embodiments of the present disclosure relate generally to an over-the-air test system for measuring the radiation performance as a function of temperature of a device under test. Further, embodiments of the present disclosure generally relate a method for measuring the over-the-air performance of a device under test as a function of temperature of the device under test.

BACKGROUND

Over-the-air measurements (OTA measurements) are inter alia done to perform telecommunication standard conformance tests for verifying the respective radiation properties of the device under test. For instance, the device under test is tested for the telecommunication standard 3GPP by performing three-dimensional OTA measurements.

In times of an increasing number of wireless communication applications being exposed to different ambient conditions (atmospheres) such as varying temperatures, there is a growing need of an over-the-air test system as well as a method for investigating a device under test with respect to its temperature behavior.

In the state of the art, methods and systems are known that are used for testing an antenna unit of a device under test wherein a static chamber is positioned around the antenna unit of the device under test wherein a certain atmosphere (ambient conditions) is applied for the testing. Hence, the device under test is only partly covered by the chamber resulting in a leakage of the atmosphere applied which is inefficient on the one hand and might impair the validity of the testing on the other hand. In addition, test scenarios comprising several different tests cannot be applied due to the instable atmosphere.

In addition, these systems and methods cannot be used for three-dimensional OTA measurements due to the arrangement of the chamber and the device firmly connected to the chamber for adapting the atmosphere within the chamber.

Further, the influence of a radio frequency circuit connected to the antenna unit is not tested by those systems and methods as only the antenna unit is encompassed by the respective chamber providing a certain testing atmosphere. Therefore, the impact of the temperature on the whole device under test is not investigated in total.

Accordingly, there is a need for an over-the-air test system as well as a method ensuring high validity of the measurement results while measuring the impact of temperature on the device under test in total, in particular the respective radio frequency circuit of the device under test processing the respective signals transmitted and/or received by the antenna unit.

SUMMARY

Embodiments of the present disclosure provide an over-the-air test system for measuring the radiation performance as a function of temperature of a device under test having at least one antenna unit and at least one radio frequency circuit, wherein the over-the-air test system comprises:

a measurement antenna unit;

a measurement unit for at least one of signal generation and signal analysis;

an enclosure that provides an internal space for accommodating the device under test for testing purposes in a sealed manner; and an atmosphere conditioning system that is configured to adapt the atmosphere within the internal space, wherein the enclosure comprises at least one sealable opening via which the internal space is connectable with the atmosphere conditioning system to adapt the atmosphere within the internal space for the testing.

Further, embodiments of the present disclosure provide a method for measuring the over-the-air performance of a device under test as a function of temperature of the device under test, comprising the following steps:

providing a device under test with at least one antenna unit and at least one radio frequency circuit;

placing the device under test in an enclosure;

adapting the atmosphere in the enclosure, for example the temperature and/or the pressure, by guiding air into the enclosure and/or by guiding air from the enclosure via an atmosphere conditioning system until a predetermined atmosphere is reached;

sealing off the enclosure by closing at least one opening used for adapting the atmosphere in the enclosure; and performing the over-the-air measurement.

Accordingly, the temperature dependency of a device under test used for telecommunication purposes can be investigated more accurately and with higher validity by exposing the whole device under test to the respective atmosphere (ambient conditions). Thus, the device under test, comprising at least one antenna unit and at least one radio frequency circuit (RF circuit), is located completely within the enclosure such that the radio frequency circuit is also exposed to the respective atmosphere. Hence, the part of the device under test processing the signals received and/or transmitted via the antenna unit is also exposed to the respective atmosphere in order to investigate the behavior of the whole device under test.

Since the whole device under test is located within the enclosure, a baseband unit may also be located within the enclosure as being part of the device under test.

Further, the efficiency of the testing is improved since the opening used for adapting the atmosphere for testing purposes is sealed off during the testing so that it is ensured that the atmosphere, for instance the pressure and/or temperature, within the internal space can be maintained for a long time, for example in a stable manner. In other words, the air within the internal space does not escape as the internal space is closed or rather sealed off with respect to the environment.

For instance, the at least one sealable opening comprises a check valve permitting gas flow only into one direction.

As the at least one opening is established as a sealable opening, it is ensured that the atmosphere within the internal space can be adapted for testing purposes easily, namely when the at least one opening is not sealed off. In addition, the atmosphere can be maintained constant during the testing when the device under test is accommodated in the enclosure by sealing off the at least one opening. Thus, the device under test is located within the enclosure in a sealed manner during the testing.

In addition, the atmosphere conditioning system is not connected to the enclosure during the testing of the device under test. This ensures that the atmosphere conditioning system does not affect the atmosphere during the testing as not gas exchange is enabled.

In other words, the atmosphere conditioning system is a connectable atmosphere conditioning system as it can be connected to the enclosure via the sealable opening for adapting the atmosphere within the enclosure.

In general, the over-the-air test system has at least two different operation modes.

In the first operation mode, an atmosphere conditioning operation mode, the atmosphere conditioning system is connected to the enclosure, for example via the at least one sealable opening, in order to adapt the atmosphere within the internal space. Hence, the at least one sealable opening enables a gas exchange between the internal space and the atmosphere conditioning system.

In the second operation mode, the testing operation mode, the atmosphere conditioning system is disconnected from the enclosure wherein the at least one sealable opening is sealed off such that the device under test is accommodated in the enclosure in a sealed manner. The atmosphere established in the internal space cannot escape due to the sealed off opening.

In other words, in the first operation mode, namely the atmosphere conditioning operation mode, the atmosphere conditioning system is connected to the enclosure, for example via the at least one sealable opening.

In the second operation mode, namely the testing operation mode, the atmosphere conditioning system is disconnected from the enclosure wherein the at least one sealable opening is sealed off.

Accordingly, the over-the-air test system corresponds to a self-contained climate system for over-the-air measurements of the device under test.

In general, the over-the-air test system (OTA test system) is configured to perform one-dimensional, two-dimensional as well as three-dimensional testing of the radiation performances of the device under test since the whole device under test is located within the enclosure providing the desired atmosphere for the device under test.

As the device under test is completely accommodated in the enclosure, the enclosure completely covers the entire device under test.

The measurement antenna unit is connected to the measurement unit such that signals may be exchanged between the measurement antenna unit and the measurement unit wherein the signals may correspond to signals received via the measurement antenna unit and/or signals generated and transmitted via the measurement antenna unit.

At least the measurement antenna unit may be configured to be movable, rotatable, tiltable, pivotable, or any combination thereof.

The atmosphere conditioning system is generally located outside of the enclosure.

The atmosphere conditioning system is configured to be driven relative to the enclosure.

The atmosphere conditioning system is configured to be driven towards the enclosure to couple with the enclosure via the sealable opening, namely in the atmosphere conditioning operation mode. Further, the atmosphere conditioning system is configured to be driven away from the enclosure to decouple from the enclosure, namely in the testing operation mode.

According to an aspect, the enclosure is configured such that a gap is provided between the device under test and the inner surface of the enclosure. The inner surface of the enclosure does not contact the device under test. The device under test may be positioned on a stand or platform defining a testing position for the device under test within the enclosure. The enclosure confines the internal space which might be filled with air of a certain temperature and/or pressure such that it is ensured that the device under test can be tested at different temperatures and/or pressures.

The platform defining the testing position for the device under test may be connected with the enclosure in order to define a sealed space for the device under test.

Moreover, the atmosphere conditioning system may comprise a control unit which controls the atmosphere within the internal space. The atmosphere (or rather the ambient conditions) of the internal space may be varied by the atmosphere conditioning system in a controlled manner such that the temperature and/or the pressure the device under test is exposed to can be varied in a desired manner during a test scenario applied. The test scenario may comprise several different test steps defined by different testing conditions, for example different atmospheres. In order to obtain the predetermined ambient conditions (atmospheres), the control unit controls the atmosphere conditioning system appropriately.

The atmosphere conditioning system may comprise a blower and/or a temperature conditioning unit such as a heating unit and/or a cooling unit.

In some embodiments, the atmosphere conditioning system comprises a piping system for guiding air from the internal space and/or for guiding air to the internal space. For instance, the piping system may be connected with the heating unit and/or the blower for blowing the air into the internal space and/or sucking the air out of the internal space depending on the test scenario applied. The piping system may have an interface interacting with the sealable opening such that the conditioned air (heated and/or pressurized) can be guided into the internal space for adapting the atmosphere in a desired manner. The interface of the piping system may be established such that the sealable opening is automatically opened when the interface comes into contact with the opening.

Generally, the at least one opening may be configured to process an air stream into the internal space and/or to process an air stream from the internal space. As mentioned above, the at least one opening may comprise a check valve ensuring that the air stream may only flow into one direction. For adapting the atmosphere within the internal space, at least two openings may be provided.

The at least one opening may also be configured to enable an air stream in both directions depending on the operating status of the atmosphere conditioning system, for example the blower, and/or the pressure relationships, namely the atmosphere pressures within the internal space and of the environment.

Furthermore, the enclosure may be made of a radio frequency neutral material. The radio frequency neutral material corresponds to a radio frequency transparent material. This material ensures that the over-the-air measurements of the device under test encapsulated completely within the enclosure can be performed appropriately since the measurement antenna unit used for the tests is located outside the enclosure. Thus, the electromagnetic waves may penetrate through the enclosure due to the radio frequency neutral material. The radio frequency neutral material ensures that the enclosure has no influence on the radio frequency signals or rather the electromagnetic waves used for the measurements.

According to an embodiment, the enclosure comprises an inflatable layer, for example a balloon-like layer. Thus, the pressure in the internal space can be adapted appropriately since the appropriate layer, for example the whole enclosure, may be inflated when the pressure is increased.

Furthermore, the enclosure may have at least two layers spaced apart from each other such that an air gap is provided between both layers. The air gap provided between both layers reduces condensation effects as the air gap acts as an insulation layer. Hence, the measurement accuracy and its validity are increased simultaneously. Moreover, condensation effects can be reduced or rather eliminated.

In addition, a positioning unit for the enclosure may be provided, for example wherein the enclosure is placed on the positioning unit. The positioning unit may be a movable one such that the whole device under test located within the enclosure during the testing can be moved appropriately.

For instance, the positioning unit is configured to enable a three-dimensional movement such that three-dimensional OTA measurements can be done easily. For this purpose, the positioning unit defines a testing position for the device under test. The testing position and the device under test located there may be rotated about an axis by the positioning unit. Further, the positioning unit may allow a tilting movement as well as a height adjustment.

Generally, the positioning unit may be configured to tilt, pivot and/or rotate the enclosure placed on the positioning unit. In other words, the positioning unit is configured to manipulate the position of the device under test in roll, azimuth and/or elevation such that three dimensional measurements can be performed appropriately.

The positioning unit may be directly connected to the enclosure, for example forming a part of the enclosure. Thus, the enclosure corresponds to a cover that is connected to a platform of the positioning unit in a sealed manner such that the device under test is accommodated in the enclosure in a sealed manner.

Alternatively, the positioning unit providing a platform or rather the testing position for the device under test penetrates partly through the enclosure in a sealed manner. Hence, the device under test is only moved, tilted and/or rotated via the positioning unit within the enclosure.

Moreover, the enclosure comprises an interface panel for establishing connections between the device under test and periphery devices, for example cable connections. The interface panel may comprise sockets and/or connectors for power cables, fiber optics and/or radio frequency connectors. The respective cables and/or connectors may be used for control signals as well as signal pass-throughs. Hence, the device under test being encapsulated by the enclosure can be controlled via the interface panel appropriately even though the enclosure is sealed off during the testing.

The periphery devices may be the members of the measurement unit used for signal generation and/or signal analyzers or any other measurement equipment.

The interface panel may be provided at the side facing to the positioning unit, for example the platform on which the enclosure is placed for moving, rotating and/or tilting.

Furthermore, the measurement antenna unit may comprise at least one of a single antenna, an antenna array and a hardware-based near-field to far-field transform unit. Thus, different testing scenarios may be applied due to the different measurement antenna unit used.

Moreover, the measurement antenna unit may comprise a plurality of different antennas, for instance an antenna array as well as a single antenna, being used for different testing purposes. The appropriate antenna(s) may be selected depending on the testing purposes.

Further, the over-the-air test system may comprise a device under test that has at least one antenna unit and at least one radio frequency circuit. Hence, the device under test itself is part of the OTA test system.

For instance, the over-the-air test system also comprises an anechoic chamber. The measurement antenna unit as well as the device under test may be assigned to the anechoic chamber, for example placed in this chamber. The anechoic chamber may be covered internally with radio frequency absorbing material to reduce or even eliminate interferences disturbing the measurements.

According to an aspect, the over-the-air measurements (OTA) are performed in one dimension, two dimensions or three dimensions. Thus, the radiation performance of the device under test can be obtained with high accuracy for all relevant application scenarios.

Furthermore, the atmosphere in the enclosure is re-adapted by connecting the atmosphere conditioning system with the enclosure for ventilation and/or changing the atmosphere. Thus, the device under test placed within the enclosure may be exposed to different ambient conditions (atmospheres) subsequently. For this purpose, the enclosure is connected with the atmosphere conditioning system again in an appropriate manner. It is not necessary to open the enclosure completely as the atmosphere conditioning system is only connected to the enclosure via the sealable opening.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 1 shows schematically a representative embodiment of an over-the-air test system according to the present disclosure in a testing operation mode;

FIGS. 2*a* and 2*b* show a detail of the over-the-air test system of FIG. 1 during an atmosphere conditioning operation mode and the testing operation mode;

DETAILED DESCRIPTION

Figure 3:
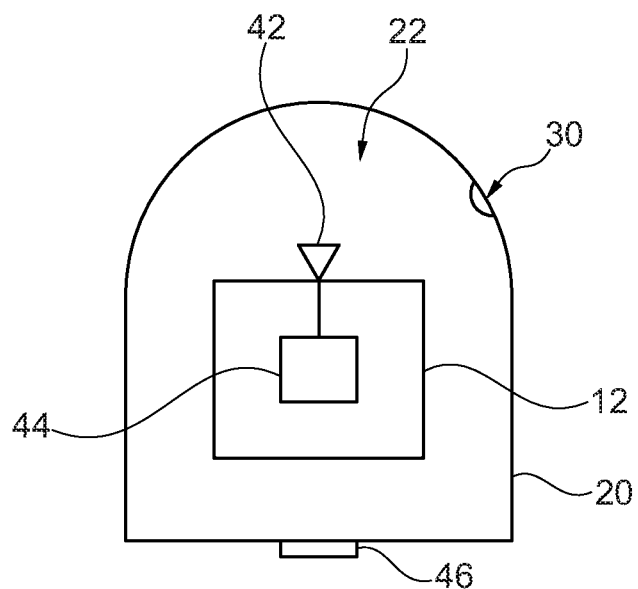
FIG. 3 shows an enclosure of the over-the-air test system according to an embodiment.

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

In FIG. 1, an over-the-air test system 10 for measuring the radiation performance of a device under test 12 is shown wherein the over-the-air test system 10 (OTA test system) comprises a measurement device 14 that has a measurement unit 16 for signal generation and/or signal analysis as well as a measurement antenna unit 18 that is connected to the measurement unit 16 for transmitting the signal generated and/or receiving a signal generated by the device under test 12.

Accordingly, the over-the-air test system 10 is generally configured to test the receiving properties as well as the transmission properties of the device under test 12.

As shown in FIG. 1, the measurement device 14 is at least partly movable. For instance, the measurement antenna unit 18 is pivotable with respect to the device under test 12 as indicated by the arrows. In addition thereto, the measurement device 14, for example the measurement antenna unit 18, can be moved linearly for adjusting the height or rotated about its axis.

Furthermore, the whole measurement device 14 can be moved with respect to the device under test 12 as mentioned above. Thus, the radiation performance of the device under test 12 can be tested under different testing scenarios, for example radiation angles (impinging angles).

Further, the OTA test system 10 comprises an enclosure 20 that defines an internal space 22 which is used for accommodating the device under test 12 during the testing as shown in FIG. 1. The internal space 22 provided by the enclosure 20 corresponds to a sealed off space.

In the shown embodiment, the enclosure 20 comprises a first outer layer 24 as well as a second inner layer 26 wherein both layers 24, 26 are spaced apart from each other such that an air gap 28 is established between both layers. This air gap 28 may be used for insulation purposes as will be described later.

In addition, the second inner layer 26 may be established by an inflatable layer such that the inner layer 26 is configured to adapt its shape when it is inflated, for example the pressure within the internal portion of the enclosure 20 increases. Thus, the inner layer 26 may expand into the air gap 28 provided between both layers 24, 26 when the associated space is inflated. Accordingly, the inner layer 26 corresponds to a balloon-like layer.

In addition, the enclosure 20 is generally configured such that a gap is provided between the device under test 12 and the inner surface of the enclosure 20 being defined by the inner surface of the inner layer 26 in this embodiment. This gap is part of the internal space 22 that is used for accommodating the device under test 12. In general, the gap ensures that the inner surface of the enclosure 20, for example the one of the inner layer 26, does not entirely contact the device under test 12.

In addition, the enclosure 20 has at least one sealable opening 30 as shown in FIG. 1 that may established a connection between the internal space 22 and the outer circumference of the enclosure 20 when the opening 30 is opened such that the atmosphere (ambient condition) within the internal space 22 can be adapted appropriately via the sealable opening 30.

Hence, the sealable opening 30 establishes an interface for adapting the atmosphere of the internal space 22 as will be described later.

For adapting the atmosphere within the internal space 22, the over-the-air test system 10 comprises an atmosphere conditioning system 32 that is also shown in FIG. 1 on the right hand side. As shown in FIG. 1, the atmosphere conditioning system 32 is not connected with the enclosure 20 since it is located apart from the enclosure 30 when the OTA system 10 is in the testing operation mode as shown in FIG. 1.

However, the atmosphere conditioning system 32 may be connected with the enclosure 20 for adapting the atmosphere within the internal space 22 appropriately in another operation mode of the OTA system, the atmosphere adapting operation mode. Hence, the atmosphere conditioning system 32 is generally configured to adapt the atmosphere within the internal space 22 when it is connected to the enclosure 20 via the sealable opening 30 as will be described later.

As shown in FIG. 1, the atmosphere conditioning system 32 comprises a control unit 34 that is connected to a blowing, cooling and/or heating unit 36 which in turn is connected to a piping system 38 having an interface 40 to be connected with the at least one sealable opening 30 for adapting the atmosphere within the internal space 22. The blowing, cooling and/or heating unit 36 may be established by at least two different sub-units, for instance a blower and a temperature conditioning sub-unit.

Generally, the atmosphere conditioning system 32 may be configured to adapt the pressure and/or temperature within the internal space 22 by guiding air via the piping system 38. For instance, air is guided from the environment into the internal space 22 or air is sucked from the internal space 22 and guided to the environment. In other words, the internal space 22 may be inflated and/or deflated. Hence, the control unit 34 may also control the direction of the air stream as well as the pressure within the internal space 22 appropriately.

The temperature of the atmosphere within the internal space 22 may also be controlled by the control unit 34 indirectly as the control unit 34 controls the cooling and/or heating unit 36 of the atmosphere conditioning system 32 appropriately.

Generally, the enclosure 20 may comprise several sealable openings 30 that might be configured to process an air stream only in one direction, namely an air stream into the internal space 22 or from the internal space 22 to the environment. For this purpose, the respective sealable opening 30 may comprise a check valve.

However, the at least one sealable opening 30 may also be configured to permit gas flow in both directions such that the gas exchange may be established via the at least one opening 30.

As shown in FIG. 1, the device under test 12 comprises at least one antenna unit 42 as well as at least one radio frequency circuit 44 connected to the antenna unit 44. The whole device under test 12 is located within the enclosure 20, namely within the internal space 22. Thus, the antenna unit 42 as well as the radio frequency circuit 44 both are exposed to the same atmosphere within the internal space 22 as both are located within the enclosure 20 in a sealed manner. In other words, the whole device under test 12, comprising the at least one antenna unit 42 as well as the at least one radio frequency circuit 44, is tested under the same ambient conditions (atmosphere), namely the one within the internal space 22 being adapted previously via the atmosphere conditioning system 32.

As the radiation performance of the device under test 12, namely the receiving properties as well as the transmission properties, shall be tested by the over-the-air test system 10, the enclosure 20 is made of a radio frequency neutral material to ensure that the electromagnetic waves may pass through the enclosure 20. Hence, the device under test 12 and the measurement device 14 may interact with each other by exchanging electromagnetic waves required for testing the radiation performance(s) of the device under test 12.

For connecting the device under test 12 within the enclosure 20, namely during the testing, an interface panel 46 is provided that is assigned to the inner space 22 and the outer space of the enclosure 20 such that (cable) connections or the like between the device under test 12 and periphery devices of the OTA test system 10 can be established via the interface panel 46.

The periphery devices may be power sources, signal sources or the measurement device 14 itself.

Hence, the interface panel 46 may have connectors and/or sockets for cables, signal cables, power cables, fiber optics and/or radio frequency connectors wherein these members may be used for controlling purposes and/or signal pass-throughs. In some embodiments, the interface panel 46 may be part of the enclosure 20.

In addition, the OTA test system 10 comprises a positioning unit 48 for the enclosure 20 that may be positioned on the positioning unit 48 in order to be moved or rotated appropriately for testing the radiation performances under different angles. For instance, the positioning unit 48 may be configured to perform three-dimensional movements (rotational, tilting, pivoting, swiveling and/or linear movements) which simplifies multiple-dimensional measurements of the radiation performances of the device under test 12 such as two- or three-dimensional measurements.

As shown in FIG. 1, the interface panel 46 is provided at the side of the enclosure 20 facing the positioning unit 48. For instance, the interface panel 46 and the positioning unit 48 may establish by a plug-in interface in a sealed manner, for example a fixed one.

The whole enclosure 20 as well as the device under test 12 located therein may be positioned on the positioning unit 48 for being moved, rotated, swiveled, pivoted and/or tilted during the testing, for example the testing scenario applied.

However, the positioning unit 48 may also comprise a platform defining a testing position for the device under test 12 wherein the platform passes through the enclosure 20 in a sealed manner such that only the platform and the device under test 12 is moved appropriately within the enclosure 20 that remains stationary in contrast thereto.

In FIGS. 2a and 2b, the OTA test system 10 is shown in its atmosphere conditioning operation mode (FIG. 2a) as well as the testing operation mode (FIG. 2b) in more detail.

In FIG. 2a, the atmosphere conditioning operation mode is shown in which the atmosphere within the internal space 22 is adapted by the atmosphere conditioning system 32 being connected to the enclosure 20.

For this purpose, the atmosphere conditioning system 32 is connected to the enclosure 20 via the sealable opening 30 and the interface 40 of the piping system 38. Thus, the piping system 38 is coupled to the enclosure 20 such that air can be blown into the internal space 22 for increasing the pressure and/or adapting the temperature within the internal space 22 depending on the cooling and/or heating unit 36. Alternatively, the internal space 22 may be deflated by sucking air from the internal space 22.

Once the atmosphere within the internal space 22 has reached the predetermined conditions, namely temperature and/or pressure, the enclosure 20 is sealed off by disconnecting the atmosphere conditioning system 32 from the enclosure 20 and closing or rather sealing off the sealable opening 30 as shown in FIG. 2b. For instance, the sealable opening 30 may seal off itself automatically when the interface 40 is brought out of contact.

Thus, the atmosphere conditioning system 32 is no more connected to the enclosures 20 such that it is ensured that the movability of the over-the-air test system 10, for example the enclosure 20 and the device under test 12 accommodated in the enclosure 20, is not impaired by the atmosphere conditioning system 32 during testing the device under test 12. Accordingly, three dimensional movements such as tilting, swiveling, rotational and/or linear movements are possible.

Hence, the enclosure 20 and the whole device under test 12 accommodated therein positioned on the positioning unit 48 may be moved freely as the atmosphere conditioning system 32 is disconnected from the enclosure 20.

Figure 4:
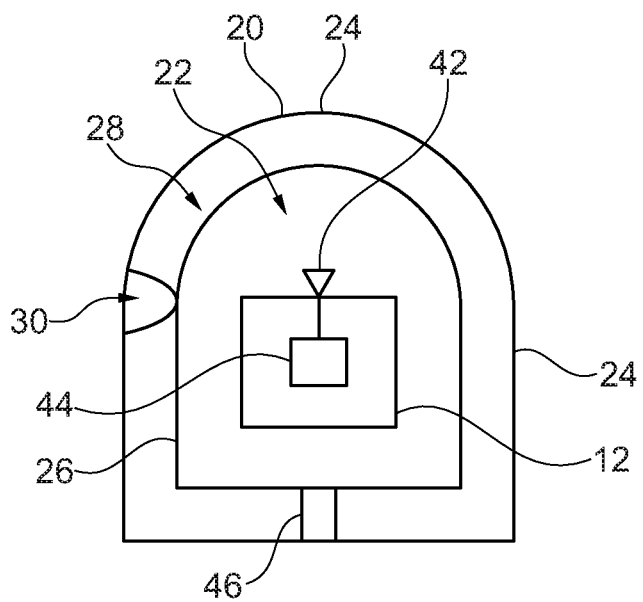
FIG. 4 shows an enclosure of the over-the-air test system according to another embodiment.

In FIGS. 3 and 4, two different embodiments of the enclosure 20 are shown. In FIG. 3, the enclosure 20 comprises a single layer enclosure 20 being inflatable. In contrast thereto, the enclosure 20 shown in FIG. 4 corresponds to the one shown in FIG. 1. The two layers 24, 26 as well as the air gap 28 provided between them ensure that a thermal insulation is provided. Moreover, condensation effects are reduced or even eliminated which might influence the measurements.

Generally, the OTA test system 10 shown in FIG. 1 can be used for measuring the over-the-air performance of the device under test 12 as a function of temperature of the device under test 12. For this purpose, the device under test 12 is provided and placed within the enclosure 20.

Then, the atmosphere within the enclosure 20, for example the temperature and/or the pressure, is adapted by guiding air into the enclosure 20 and/or by guiding air from the enclosure 20 via the atmosphere conditioning system 32 until a predetermined atmosphere is reached.

Once the intended atmosphere is reached, the atmosphere conditioning system 32 is disconnected from the enclosure 20 and the enclosure 20 is sealed off by closing the at least one sealable opening 30 which was previously used for adapting the atmosphere in the enclosure 20.

As the device under test 12 is exposed to the atmosphere, the device under test 12 has substantially the same temperature as the atmosphere after a certain time as it is heated up or cooled down by the atmosphere within the internal space 22.

Then, the over-the-air measurements intended can be performed appropriately. Accordingly, different application conditions can be simulated by the OTA system 10.

Since the enclosure 20, for example the internal space 22, is sealed off completely, the atmosphere can be maintained for long duration in a stable manner during the testing.

Due to the movable positioning unit 48, the radiation performance of the device under test 12 can be tested for one, two or three dimensions depending on the test scenario applied.

Furthermore, the radiation characteristics or rather radiation performances of the device under test 12 can be tested as function of the temperature of the device under test 12 itself, for example the temperature of the antenna unit 42 as well as the temperature of the radio frequency circuit 44, by adapting the atmosphere to different atmospheres, for example temperatures and/or pressures.

For instance, the OTA measurements are done for a first atmosphere (first ambient conditions) wherein the atmosphere is re-adapted by connecting the atmosphere conditioning system 32 with the enclosure 20 again for ventilation and/or changing the atmosphere within the internal space 22.

Hence, the temperature and/or pressure may be varied for a second test step of the testing scenario such that the device under test 12 can be tested for different atmospheres in order to investigate the temperature behavior of the while device under test 12.

In some embodiments, the temperature behavior of the radio frequency circuit 44 of the device under test 12 can be investigated by measuring the radiation properties of the device under test 12.

Generally, the measurement antenna unit 18 used for testing the device under test 12 may comprise at least one of a single antenna, an antenna array and a hardware-based near-field to far-field transform unit. Hence, different antennas may be used for different testing purposes.

Various components, including the measurement device 14, the measurement unit 16, the measurement antenna unit 18, the control unit 34, the antenna unit 42, the frequency circuit 44, the positioning unit 48, etc., may include, in some embodiments, logic for implementing the technologies and methodologies described herein. This logic can be carried out in either hardware or software, or a combination of hardware and software. In some embodiments, one or more of these components includes one or more computing devices such as a processor (e.g., a microprocessor), a central processing unit (CPU), a digital signal processor (DSP), an application-specific integrated circuit (ASIC), a field-programmable gate array (FPGA), or the like, or any combinations thereof, and can include discrete digital or analog circuit elements or electronics, or combinations thereof. In an embodiment, one or more of these components includes combinations of circuits and computer program products having software or firmware instructions stored on one or more computer readable memories that work together to cause an associated device to perform one or more methodologies or technologies described herein.

The present application may also reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An over-the-air test system for measuring the radiation performance as a function of temperature of a device under test having at least one antenna unit and at least one radio frequency circuit, wherein the over-the-air test system comprises:
   a measurement antenna unit;
   a measurement unit for at least one of signal generation and signal analysis;
   an enclosure that provides an internal space for accommodating the device under test for testing purposes in a sealed manner; and
   an atmosphere conditioning system that is configured to adapt the atmosphere within the internal space,
   wherein the enclosure comprises at least one sealable opening via which the internal space is connectable with the atmosphere conditioning system to adapt the atmosphere within the internal space for the testing,
   wherein, in an atmosphere conditioning operation mode of the test system, the atmosphere conditioning system is connected to the enclosure via the at least one sealable opening in order to adapt the atmosphere within the internal space, and
   wherein, in a testing operation mode of the test system, the atmosphere conditioning system is disconnected from the enclosure and the at least one sealable opening is sealed off such that the device under test is accommodated in the enclosure in a sealed manner.

2. The over-the-air test system according to claim 1, wherein the enclosure is configured such that a gap is provided between the device under test and the inner surface of the enclosure.

3. The over-the-air test system according to claim 1, wherein the atmosphere conditioning system comprises a control unit which controls the atmosphere within the internal space.

4. The over-the-air test system according to claim 1, wherein the atmosphere conditioning system comprises a piping system for guiding at least one of air from the internal space and air to the internal space.

5. The over-the-air test system according to claim 1, wherein the at least one opening is configured to process at least one of an air stream into the internal space and an air stream from the internal space.

6. The over-the-air test system according to claim 1, wherein the enclosure is made of a radio frequency neutral material.

7. The over-the-air test system according to claim 1, wherein the enclosure comprises an inflatable layer.

8. The over-the-air test system according to claim 7, wherein the inflatable layer is a balloon-like layer.

9. The over-the-air test system according to claim 1, wherein the enclosure has at least two layers spaced apart from each other such that an air gap is provided between both layers.

10. The over-the-air test system according to claim 1, wherein a positioning unit for the enclosure is provided.

11. The over-the-air test system according to claim 10, wherein the enclosure is placed on the positioning unit.

12. The over-the-air test system according to claim 1, wherein the enclosure comprises an interface panel for establishing connections between the device under test and periphery devices.

13. The over-the-air test system according to claim 12, wherein interface panel establishes cable connections between the device under test and periphery devices.

14. The over-the-air test system according to claim 1, wherein the measurement antenna unit comprises at least one of a single antenna, an antenna array and a hardware-based near-field to far-field transform unit.

15. The over-the-air test system according to claim 1, wherein a device under test is provided that has at least one antenna unit and at least one radio frequency circuit.

16. A method for measuring the over-the-air performance of a device under test as a function of temperature of the device under test, comprising:
    providing a device under test with at least one antenna unit and at least one radio frequency circuit;
    placing the device under test in an enclosure;
    adapting the atmosphere in the enclosure by guiding at least one of air into the enclosure and air from the enclosure via an atmosphere conditioning system until a predetermined atmosphere is reached, wherein the atmosphere conditioning system is connected to the enclosure via at least one sealable opening in order to adapt the atmosphere within the internal space in an atmosphere conditioning operation mode;

disconnecting the atmosphere conditioning system from the enclosure and sealing off the enclosure by closing the at least one opening used for adapting the atmosphere in the enclosure, thereby establishing a testing operation mode; and performing the over-the-air measurements in the testing operation mode.

17. The method according to claim 16, wherein at least one of the temperature and the pressure is adapted.

18. The method according to claim 16, wherein the over-the-air measurements are performed in one dimension, two dimensions or three dimensions.

19. The method according to claim 16, wherein the atmosphere in the enclosure is re-adapted by connecting the atmosphere conditioning system with the enclosure for at least one of ventilation and changing the atmosphere.

20. An over-the-air test system for measuring the radiation performance as a function of temperature of a device under test having at least one antenna unit and at least one radio frequency circuit, wherein the over-the-air test system comprises:

a measurement antenna unit;

a measurement unit for at least one of signal generation and signal analysis;

an enclosure that provides an internal space for accommodating the device under test for testing purposes in a sealed manner; and an atmosphere conditioning system that is configured to adapt the atmosphere within the internal space, wherein the enclosure comprises at least one sealable opening via which the internal space is connectable with the atmosphere conditioning system to adapt the atmosphere within the internal space for the testing, wherein the atmosphere conditioning system is not connected to the enclosure during the testing of the device under test, thereby ensuring that the atmosphere conditioning system does not affect the atmosphere during the testing as not gas exchange is enabled.

* * * * *